United States Patent [19]

Goedicke et al.

[11] Patent Number: 5,780,803
[45] Date of Patent: Jul. 14, 1998

[54] PROCESS FOR THE STABILIZATION OF PLASMA GENERATION BY MEANS OF ELECTRON BEAM VAPORIZER

[75] Inventors: Klaus Goedicke; Volker Kirchhoff; Christoph Metzner; Bert Scheffel, all of Dresden, Germany

[73] Assignee: Fraunhofer-Gesellschaft zur Forderung der angewandten Forschung e.V., Munich, Germany

[21] Appl. No.: 821,030

[22] Filed: Mar. 20, 1997

Related U.S. Application Data

[63] Continuation of Ser. No. 505,267, filed as PCT/DE94/00030, Jan. 13, 1995 published as WO94/19507, Sep. 1, 1994, abandoned.

[30] Foreign Application Priority Data

Feb. 16, 1994 [DE] Germany .................. 43 04 613.4

[51] Int. Cl.$^6$ .................. B23K 10/00; B23K 15/00
[52] U.S. Cl. .................. 219/121.43; 219/121.42; 219/121.15; 219/121.34; 204/298.03; 427/585
[58] Field of Search .................. 219/121.42, 121.43, 219/121.15, 121.34, 121.35, 121.59; 204/298.01, 298.04, 298.03; 427/585, 556, 570

[56] References Cited

U.S. PATENT DOCUMENTS

| | | |
|---|---|---|
| 3,562,141 | 2/1971 | Morley. |
| 4,311,725 | 1/1982 | Holland .................. 427/10 |
| 4,511,594 | 4/1985 | Yanai et al. |
| 5,286,947 | 2/1994 | Clyde et al. .................. 219/121.83 |
| 5,316,955 | 5/1994 | Govorchin .................. 436/155 |
| 5,423,970 | 6/1995 | Kugler .................. 204/298.03 |

FOREIGN PATENT DOCUMENTS

| | | |
|---|---|---|
| 0 329 179 | 8/1989 | European Pat. Off. |
| 36 27 151 | 2/1988 | Germany. |
| 41 05 014 | 8/1992 | Germany. |

OTHER PUBLICATIONS

"Activated Reactive Evaporation Process for High Rate Deposition of Compounds," R.F. Bunshah & A.C. Raghuram, J. Vac. Sci. Technol., vol. 9, No. 6, Nov.–Dec. 1972, pp. 1385–1388.

"Towards a Possible Industrial Production of Ozone with an Electron–Beam–Controlled Discharge," G. Fournier et al., Proc. 4th Int. Symp. on Plasma Chemistry, Zürich 1979, Bd. 2, S. 742–747.

*Primary Examiner*—Mark H. Paschall
*Attorney, Agent, or Firm*—Evenson, McKeown, Edwards & Lenahan, P.L.L.C.

[57] ABSTRACT

The invention relates to a process for stabilizing plasma generation in the coating of large substrate surfaces by means of an electron beam vaporizer. To obtain a stable operation of the apparatus at a high vaporization rate and stable plasma excitation of the vapour cloud without using additional electrodes, according to the invention the vaporization rate of the electron beam vaporizer is initially set so high that at least 10% of the electron beam power is absorbed in the vaporization chamber by the vapour and the optical emission of the resulting plasma is measured. The operating parameters of the electron gun or a process parameter are then controlled in such a way that the optical emission, and therefore the energy absorption, remains constant.

8 Claims, 1 Drawing Sheet

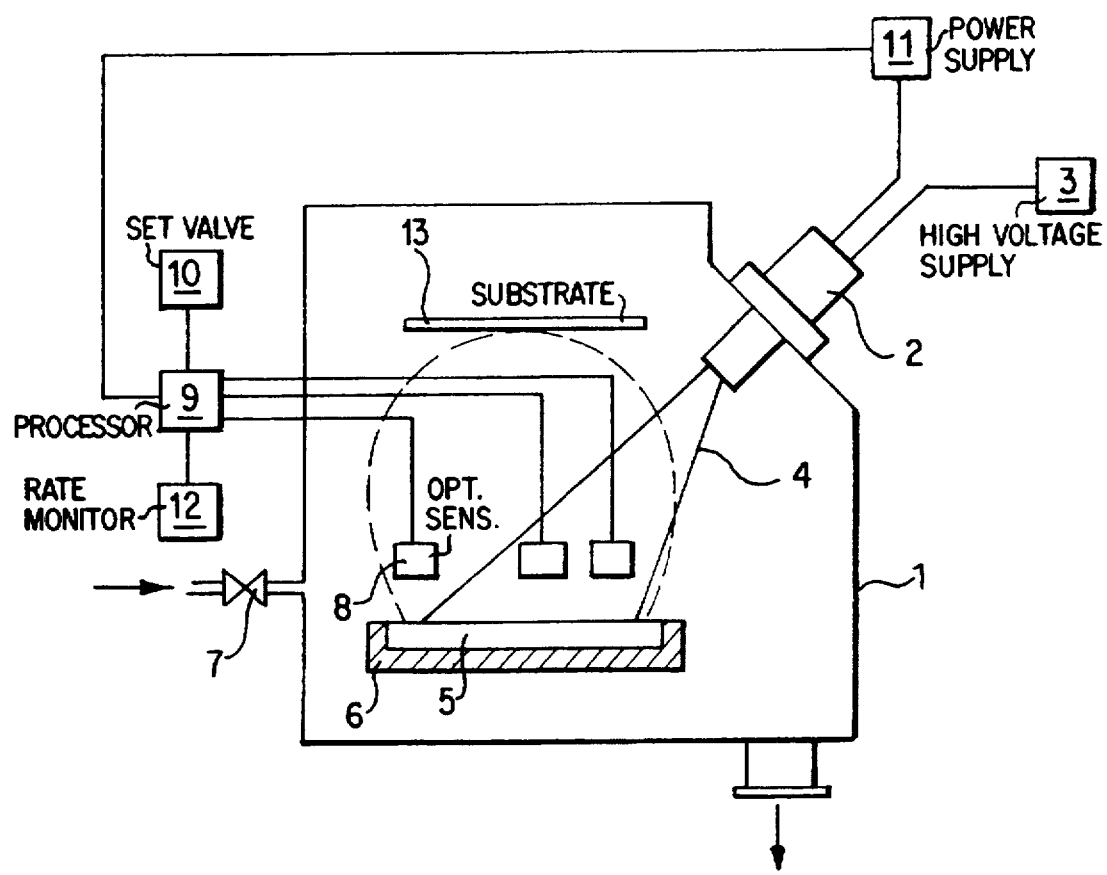

PROCESS FOR THE STABILIZATION OF PLASMA GENERATION BY MEANS OF ELECTRON BEAM VAPORIZER

This application is a continuation of application Ser. No. 08/505,267, filed as PCT/DE94/00030, Jan. 13, 1995 published as WO94/19507, Sep. 1, 1994 now abandoned.

BACKGROUND AND SUMMARY OF THE INVENTION

The invention relates to a process for stabilizing plasma generation during physical vapour disposition by means of electron beam vaporization, in which the plasma is generated directly by the incident electron beam from a high power electron gun, which beam is also used for vaporization. The process is also used in reactive vacuum coatings where high demands are made on the coating structure.

Such processes are preferably used for the surface finishing of semi-finished and finished products, particularly in metallurgy, machine building, optics, as well as the glass and packaging industry.

The use of high power electron guns has made it possible to coat large substrate surfaces at low cost. In the known operating procedure for such electron guns, a disadvantage of this process has been the low plasma excitation of the vapour (which is lower by a multiple than in a sputtering process, for example). For this reason, the coating characteristics achieved by this process do not generally meet the demands, despite the high vaporization rates which can be attained. A further disadvantage of the low plasma efficiency is the associated low reactivity of the vapour, so that reactive coating operations can be successfully performed only with the aid of an additional plasma excitation. Various apparatuses and processes are conventionally used for such a plasma excitation.

It is known to achieve the necessary plasma excitation with the aid of a hollow cathode discharge (U.S. Pat. No. 3,562,141).

It is also known to use special glow discharges, which are produced by means of an annular additional anode for the additional excitation of the vapour (Bunshah und Raghuram "Activated Reactive Evaporation Process for High Rate Deposition of Compounds", J. Vac. Sci. Technol., Vol. 9, No. 6, November-December 1972, pp. 1385 to 1388).

It is also known in the case of electron beam vaporization to produce an additional inner space in which a glow discharge is ignited (DE 3,627,151 A1).

These known processes, with their necessary additional apparatus, suffer from the disadvantage that the necessary electrodes (which, as a result of the process, are directly located in the vaporizing chamber or in the vapour stream) must be provided with a special vacuum coating protection. Particularly in the case of high rate vacuum coating, the known protective devices are soon rendered unusable by the vacuum coating, and problems or lack of stability occur during plasma excitation. During the vaporization of insulating coatings (such as, for example, silicon dioxide or alumina, and reactive coating formation, e.g. by the vaporization of titanium in an oxygen atmosphere), within a few minutes the electrodes become electrically insulating, and therefore ineffective.

It is also known that at high vaporizer power levels, such as are attainable with high rate electron beam vaporization, vapour densities occur over the vaporization material which no longer permit the electron beam to penetrate the vapour clouds (Alecseev, A. M.; Proc. 4th Int. Symp. on Plasma Chemestry, Zurich (1979) vol. 2,742). The electron beam is then absorbed in the vapour cloud and plasma excitation occurs. However, as a result of the large energy drop due to such plasma excitation, the energy which reaches the vaporization material decreases accordingly, and the vaporization rate tends towards zero. The vapour density thus becomes very small and the electron beam can again reach the vaporization material with its full power, so that the described process is restarted and irregular oscillations occur with a frequency of below 1 Hz to a few Hz. Therefore the vaporization rate also fluctuates in a wide range, so that a continuous coating is not possible and the process is highly unstable.

In order to obviate plasma excitation and the associated instabilities at the high electron beam vaporization rates, the electron guns can be operated with high acceleration voltages, so that physically there is a low excitation probability, and therefore a good penetrating power for such dense vapour clouds. However, in this case for a plasma-assisted vacuum coating it is necessary to have separate, plasma generators, which suffer from the already described disadvantages.

Therefore, the object of the invention is to provide a process which allows stable operation of the electron beam vaporizer at a high vaporizing rate and simultaneously permits a stable plasma excitation of the vapour cloud and its planned adjustment using the electron beam, without requiring additional electrodes in the vaporization chamber. It is thus possible to produce coatings with a special coating structure and a reactive coating operation is made possible.

This object is achieved according to the invention by measuring optical emissions from the plasma generated by absorption of the electron beam during a vapor deposition process, and using the measured value in a feedback arrangement to control at least one operating parameter of the electron gun, so the optical emission, and hence the energy absorption in the vaporization chamber remain constant.

A particular advantage of the process according to the invention is that the generating of the plasma requires no additional equipment and instead takes place in parallel by means of the electron gun used for vaporization. As a result of the process the plasma excitation is also closely linked with the vapour generation, i.e. also during the deflection of the electron beam and therefore always at the place of the highest vapour density. A further advantage results from the fact that no additional electrodes are required, and approximately the same reliability is obtained for plasma excitation as for the actual vaporization process.

An advantageous development of the process in the case of large vaporizer systems is that the vaporizer crucible can be subdivided into several areas and the plasma intensity in each area can be individually measured. With the aid of these individual intensities each vaporization area can be separately regulated with respect to the plasma excitation. This makes it possible to keep the deposited coating characteristics constant over large vaporizer surfaces.

Another possibility exists when using two or more electron guns. In this case it is possible to use one electron gun with a high accelerating voltage, preferably for the vaporization and, as a function of the number of electron guns, to use the remaining electron guns with other operating parameters, preferably for plasma excitation. This process offers the possibility of a largely separate setting of the vaporizer power and plasma excitation. Because the electron gun requires no additional electrodes in the vaporization chamber, the reliability is much higher than in known solutions. Control of the operating parameters as described above takes place for at least one of the electron guns.

Other objects, advantages and novel features of the present invention will become apparent from the following detailed description of the invention when considered in conjunction with the accompanying drawings.

BRIEF DESCRIPTION OF THE DRAWINGS

FIG. 1 is a schematic depiction of a vaporizer arrangement which includes sensors and controls suitable for performing the invention.

DETAILED DESCRIPTION OF THE DRAWINGS

To a vaporization chamber 1 is flanged an axial electron gun 2 with a power rating of 300 kW, with an associated beam guidance and focussing system (not shown in detail), a high voltage supply 3 and separate vacuum production means with pressure stages (not shown). The substrate 13 to be vacuum coated is, in the usual way, positioned above the vaporizer crucible 6.

The electron gun 2 is equipped with a so-called varioanode, which allows a rapid change to the accelerating voltage of the electron beam in the case of a constant emitter power. The electron beam generated by the electron gun 2, with corresponding programming of the beam guidance and focussing system, strikes the surface of the vaporization material 5 in the vaporizer crucible 6, and produces a high vapour pressure above said material 5 which is in the range 3 Pa. Alumina is used as the vaporization material 5, and additional oxygen is introduced as the reactive gas by means of an intake valve 7.

The surface of the vaporizing material 5 is subdivided into several areas, and with each area is associated an optical sensor 8 for determining the intensity of the optical emissions from the plasma at a wavelength of 396 nm. The sensors 8 are connected to a signal processing unit 9, which compares the intensity signals with a set value of the set value presetting unit 10. As a function of this comparison a signal is supplied to the power supply unit 11 and therefore influences the accelerating voltage of the electron gun 2, as described below.

If the plasma emission intensity rises and exceeds the preset value within an area, then the associated accelerating voltage of the electron gun is also increased by modifying the varioanode at a constant power. Thus, there is a reduction of the absorbed energy in the vapour and the intensity of the optical emission decreases. However, if the intensity of the optical emission is lower than preset by the set value presetting unit 10, the accelerating voltage is automatically modified by varying the varioanode using the aforementioned control system. Therefore the energy absorption in the vapour is increased and the plasma emission intensity also rises. For setting the operating point the electron gun 2 is operated with a power of 180 kW and the vaporization rate is determined by means of the rate monitor 12. The power of the electron gun 2 is then raised to 200 kW. Simultaneously the operating point is determined by varying the set value presetting. The operating point is found if, by means of the rate monitor 12 at 200 kW electron beam power, the same rate is measured as at 180 kW.

During this performance of the process with a control constant of 100 ms a stable operation is obtained during the plasma-assisted deposition of alumina. The plasma intensity fluctuations measured by optical emission are below 10%. The overall intensity can be set within wide limits by means of the set value presetting unit 10.

For setting an energy absorption in the plasma higher than 10% the following procedure is adopted. With a high accelerating voltage, at which the absorption of the electron beam power in the vapour chamber is negligible, the vacuum deposition rate is determined. The electron beam power is then increased by a fixed amount of at least 10% and the accelerating voltage is lowered to such an extent that the vacuum deposition rate reaches the same value. The prerequisite for the stability of plasma generation is the control of the operating parameters of the electron guns, in the present example the acceleration voltage.

In this example the energy absorption is maintained constant in the vaporization chamber by controlling the accelerating voltage of the electron gun 2. This maintaining constant is also attainable in the same way by controlling the focussing or the power of the electron gun at a constant accelerating voltage. However, this maintaining constant by controlling process parameters, such as the residence time of the electron beam on a surface element of the vaporization material or the reactive gas intake is advantageous.

Although the invention has been described and illustrated in detail, it is to be clearly understood that the same is by way of illustration and example, and is not to be taken by way of limitation. The spirit and scope of the present invention are to be limited only by the terms of the appended claims.

We claim:

1. In a physical vapor deposition of a coating material in a vaporization chamber by means of an electron beam vaporizer having at least one axial electron gun with a high vaporization rate, an electron beam of the electron gun being deflected in a programmed manner by a beam guidance and focussing system onto the coating material which is vaporized thereby, a method for stabilizing plasma generation comprising the steps of:

setting a vaporization rate of the electron beam vaporizer at a predetermined level, whereby power of said electron beam is partially absorbed by vapor in said vaporization chamber, creating a plasma which generates optical emission;

measuring intensity of said optical emissions; and controlling at least one operating parameter of said at least one electron gun as a function of measured intensity of the optical emissions, whereby the optical emissions and energy absorption in the vaporization chamber remain constant.

2. Process according to claim 1, wherein:

a surface of the coating material which is vaporized is subdivided into several areas; and in each area intensity of the optical emission is measured with an optical sensor and an operating parameter is regulated with respect to that area.

3. Process according to claim 1, characterized in that the surface of the vaporization material is subdivided into several areas and in each area the intensity of the optical emission is measured with an optical sensor and then the operating parameter or process parameter is replaced.

4. Arrangement according to claim 1 wherein said at least one operating parameter is selected from the group consisting of an accelerating voltage of the electron gun, focussing of the electron gun, power of the electron gun at a constant acceleration voltage, and dwell time of the electron beam on a surface element of said coating material.

5. Arrangement according to claim 1 wherein said step of controlling at least one operating parameter of the at least one electron gun comprises:

comparing the measured intensity of said optical emissions with a preset value to obtain a difference; and adjusting said at least one operating parameter as a function of a result of said comparing, said adjusting being made in a direction which causes said difference to decrease.

6. Arrangement according to claim 1 wherein a reactive gas is introduced into the vaporization chamber.

7. Arrangement according to claim 6 wherein a supply of the reactive gas is regulated to maintain a constant energy absorption.

8. In a physical vapor deposition of a coating material in a vaporization chamber by means of an electron beam vaporizer having at least one axial electron gun with a high vaporization rate, an electron beam of the electron gun being deflected in a programmed manner by a beam guidance and focussing system onto the coating material which is vaporized thereby, a method for stabilizing plasma generation comprising the steps of:

setting a vaporization rate of the electron beam vaporizer at a predetermined level, whereby power of said electron beam is partially absorbed by vapor in said vaporization chamber, creating a plasma which generates optical emission;

measuring intensity of said optical emissions; and controlling at least one of an operating parameter of said at least one electron gun and a process parameter, as a function of measured intensity of the optical emissions, whereby the optical emissions and energy absorption in the vaporization chamber remain constant.

* * * * *